United States Patent
Tanaka et al.

(10) Patent No.: US 12,094,694 B2
(45) Date of Patent: Sep. 17, 2024

(54) SUBSTRATE PROCESSING APPARATUS AND SUBSTRATE PROCESSING METHOD

(71) Applicant: Tokyo Electron Limited, Tokyo (JP)

(72) Inventors: Sumi Tanaka, Yamanashi (JP); Tamihiro Kobayashi, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 799 days.

(21) Appl. No.: 17/149,246

(22) Filed: Jan. 14, 2021

(65) Prior Publication Data
US 2021/0225618 A1    Jul. 22, 2021

(30) Foreign Application Priority Data
Jan. 20, 2020   (JP) ................................ 2020-006866

(51) Int. Cl.
*H01J 37/32*     (2006.01)
*C23C 16/458*    (2006.01)
*C23C 16/505*    (2006.01)

(52) U.S. Cl.
CPC .... *H01J 37/32715* (2013.01); *C23C 16/4583* (2013.01); *C23C 16/505* (2013.01); *H01J 37/32522* (2013.01); *H01J 37/32642* (2013.01); *H01J 2237/2002* (2013.01); *H01J 2237/20235* (2013.01); *H01J 2237/3321* (2013.01)

(58) Field of Classification Search
None
See application file for complete search history.

(56) References Cited

U.S. PATENT DOCUMENTS

| | | | | |
|---|---|---|---|---|
| 5,525,160 A | * | 6/1996 | Tanaka | C23C 16/4401 118/500 |
| 7,824,934 B2 | * | 11/2010 | Yamamoto | G05B 19/408 438/17 |
| 7,915,179 B2 | * | 3/2011 | Sato | H01L 21/67167 438/770 |
| 8,813,678 B2 | * | 8/2014 | Sakamoto | H01L 21/0276 118/319 |
| 10,069,443 B2 | * | 9/2018 | Senzaki | H01L 21/6831 |
| 10,274,827 B2 | * | 4/2019 | Lee | G03F 7/0035 |
| 10,347,547 B2 | * | 7/2019 | Varadarajan | H01L 21/02274 |

(Continued)

FOREIGN PATENT DOCUMENTS

| | | |
|---|---|---|
| JP | H10-321524 A | 12/1998 |
| KR | 10-2001-0012685 A | 2/2001 |
| KR | 10-2021-0012685 A | 2/2021 |

*Primary Examiner* — Jethro M. Pence
(74) *Attorney, Agent, or Firm* — Venjuris, P.C.

(57) ABSTRACT

A substrate processing apparatus includes: a processing chamber including a processing room; a heating unit that heats the processing chamber; a support including a base thermally isolated from the processing chamber and fixed to the processing chamber, and a stage inserted into an opening provided toward the processing room while being supported by the base at a position distant from a reference position in a horizontal direction, and holds the substrate in the processing room; a stage peripheral member provided in the processing chamber along a periphery of the stage in a state of being inserted into the opening; and a first positioning pin fixed to the processing chamber to position the stage peripheral member, and a second positioning pin fixed to a position farther than the first positioning pin.

11 Claims, 13 Drawing Sheets

(56) References Cited

U.S. PATENT DOCUMENTS

| | | | |
|---|---|---|---|
| 10,358,715 B2* | 7/2019 | Kaufman-Osborn | ........................ H01J 37/32733 |
| 11,868,056 B2* | 1/2024 | Mizunaga | .......... H01L 21/68742 |
| 2010/0186672 A1* | 7/2010 | Okuda | ................ H01L 21/6719 118/723 R |
| 2017/0371245 A1* | 12/2017 | Lee | ........................ H01L 27/00 |
| 2020/0093027 A1* | 3/2020 | Abarra | .............. H01L 21/68792 |

* cited by examiner

SUBSTRATE PROCESSING APPARATUS AND SUBSTRATE PROCESSING METHOD

CROSS-REFERENCE TO RELATED APPLICATIONS

This application is based on and claims priority from Japanese Patent Application No. 2020-006866 filed on Jan. 20, 2020 with the Japan Patent Office, the disclosure of which is incorporated herein in its entirety by reference.

TECHNICAL FIELD

The present disclosure relates to a substrate processing apparatus and a substrate processing method.

BACKGROUND

In a substrate processing apparatus performing a processing on a substrate, a semiconductor wafer (hereinafter, referred to as a wafer) serving as a substrate is placed on a stage provided in a processing chamber, a processing gas is supplied toward the wafer, and a processing such as a film formation or an etching is performed on the wafer. In the substrate processing apparatus, the processing chamber may be heated in order to avoid adsorption of a gas to the inner surface of the processing chamber. Further, in the periphery of the stage placed in the processing chamber on which the wafer that is a processing target is placed, for example, a separation ring that partitions the space above and below the stage, a shadow ring that masks the peripheral edge of the wafer, or a clamp ring that fixes the wafer with respect to the stage may be provided. Hereinafter, the members provided in the processing chamber along the circumferential direction of the stage are referred to as stage peripheral members.

Japanese Patent Laid-Open Publication No. 10-321524 discloses a CVD device including a pedestal that moves down when a film forming processing is not performed and moves up when a film forming processing is performed in a processing chamber in which a film forming processing is performed. The CVD device is provided with a shadow ring serving as a stage peripheral member configured to cover the upper side of the outer peripheral portion of the wafer supported on the substrate support body, and a mask device including a positioning unit that disposes the shadow ring at a predetermined position in the processing chamber when the film forming processing is not performed.

SUMMARY

A substrate processing apparatus according to the present disclosure includes a processing chamber including a processing room configured to process a substrate; a heating unit configured to heat the processing chamber; a support including a base thermally isolated from the processing chamber and fixed to the processing chamber, and a stage inserted into an opening provided toward the processing room while being supported by the base at a position distant from the reference position in a horizontal direction, and configured to hold the substrate in the processing room, the reference position being a position where the base is fixed with respect to the processing chamber; a stage peripheral member provided in the processing chamber along a periphery of the stage in a state of being inserted into the opening; a first positioning pin fixed to the processing chamber to position the stage peripheral member; and a second positioning pin fixed to a position farther than the first positioning pin when viewed from the reference position in plan view. The stage peripheral member includes a first hole into which the first positioning pin is inserted in order to fix the stage peripheral member with respect to the processing chamber, and a second hole into which the second positioning pin is inserted, and formed in an elongated hole shape along a direction in which the second positioning pin moves in response to expansion and contraction of the processing chamber according to switching between a heated state by the heating unit and a non-heated state.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

First Embodiment

Figure 1:
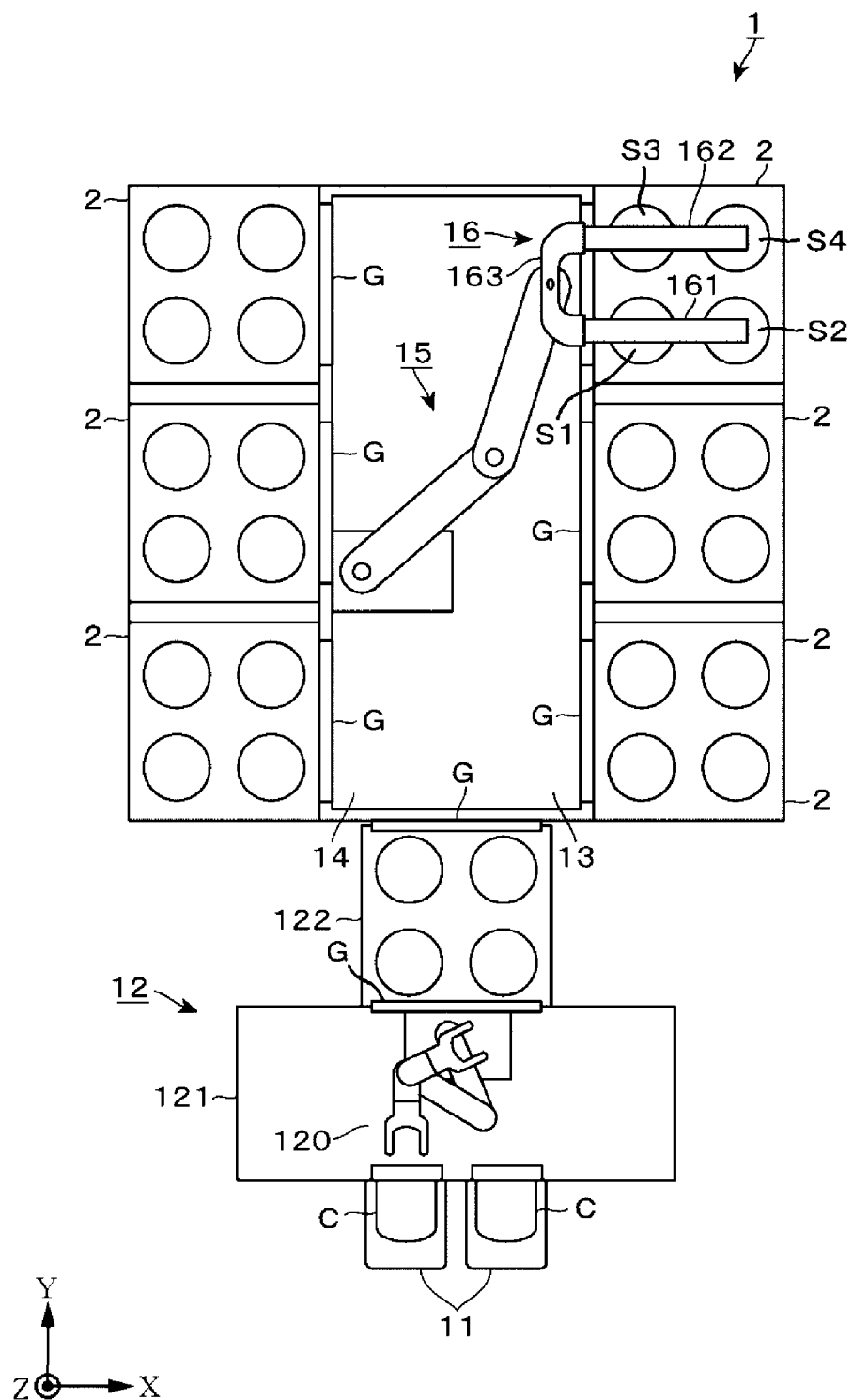
FIG. 1 is a plan view explaining a configuration of a substrate processing system according to a first embodiment.

A substrate processing system 1 to which a substrate processing apparatus 2 according to a first embodiment of the present disclosure is applied will be described with reference to a plan view in FIG. 1. The substrate processing system 1 includes a carry-in/out port 11, a carry-in/out module 12, a vacuum transfer module 13, and the substrate processing apparatus 2. In FIG. 1, the X direction will be described as the left-right direction, the Y direction will be described as the front-rear direction, and the carry-in/out port 11 will be described as the front side in the front-rear direction. The carry-in/out port 11 and the vacuum transfer module 13 are connected to the front side of the carry-in/out module 12 and to the back side of the carry-in/out module 12, in the front-rear direction, respectively.

The carry-in/out port 11 is configured to place a carrier C serving as a transfer container accommodating a wafer W to be processed, and, for example, the wafer W is a circular substrate having a diameter of 300 mm. The carry-in/out module 12 is a module configured to perform carrying-in/out of the wafer W between the carrier C and the vacuum transfer module 13. The carry-in/out module 12 includes a normal pressure transfer chamber 121 in which the wafer W is transported to and from the carrier C in a normal pressure atmosphere by a transfer mechanism 120, and a load-lock chamber 122 that switches the atmosphere in which the wafer W is placed between a normal pressure atmosphere and a vacuum atmosphere.

The vacuum transfer module 13 includes a vacuum transfer chamber 14 in which a vacuum atmosphere is formed, and a substrate transfer mechanism 15 is disposed inside the vacuum transfer chamber 14. The vacuum transfer chamber 14 has a rectangular shape, for example, having a long side in the front-rear direction, when viewed from plan view. Among the four side walls of the vacuum transfer chamber 14, a plurality (e.g., three) of substrate processing apparatus 2 is connected to the long sides of the rectangular facing each other, and the load-lock chamber 122 provided in the carry-in/out module 12 is connected to the short side at the front side. The reference numeral G in the drawing indicates a gate valve interposed between the carry-in/out module 12 and the vacuum transfer module 13, and the vacuum transfer module 13 and the substrate processing apparatus 2, respectively. The gate valves G open/close carry-in/out ports for the wafer W respectively provided in the modules connected to each other.

The substrate transfer mechanism 15 configured to perform the transfer of the wafer W between the carry-in/out module 12 and the respective substrate processing apparatuses 2 in a vacuum atmosphere includes an articulated arm and is provided with a substrate holder 16 that holds the wafer W. The substrate holder 16 includes a first substrate holder 161, a second substrate holder 162, and a connector 163, and the first substrate holder 161 and the second substrate holder 162 respectively hold two wafers W. Then, the substrate holder 16 is configured to hold, for example, four wafers W such that the four wafers W are collectively transported to the substrate processing apparatus 2.

Figure 2:
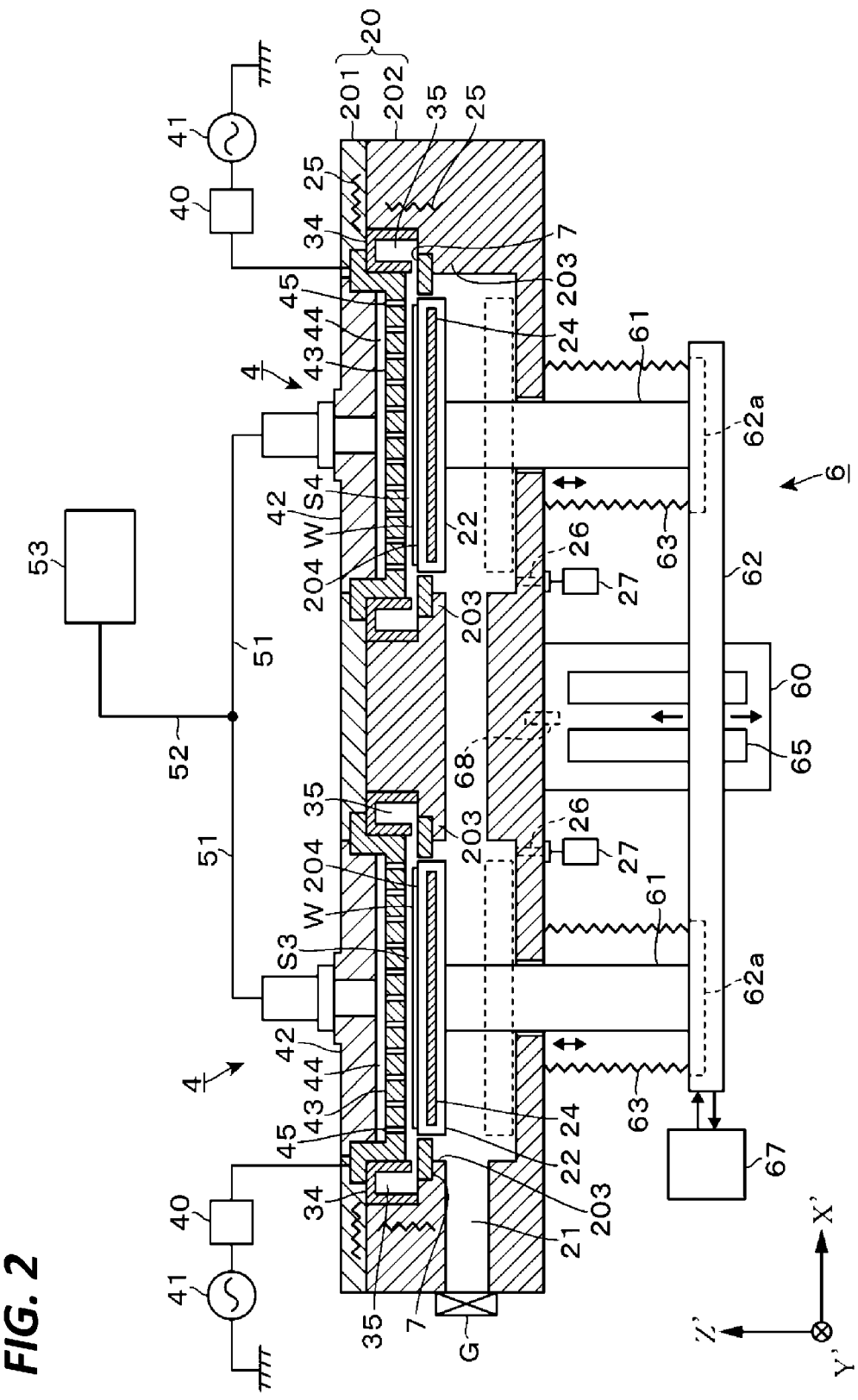
FIG. 2 is a vertical-sectional side view of a substrate processing apparatus provided in the substrate processing system.
Figure 3:
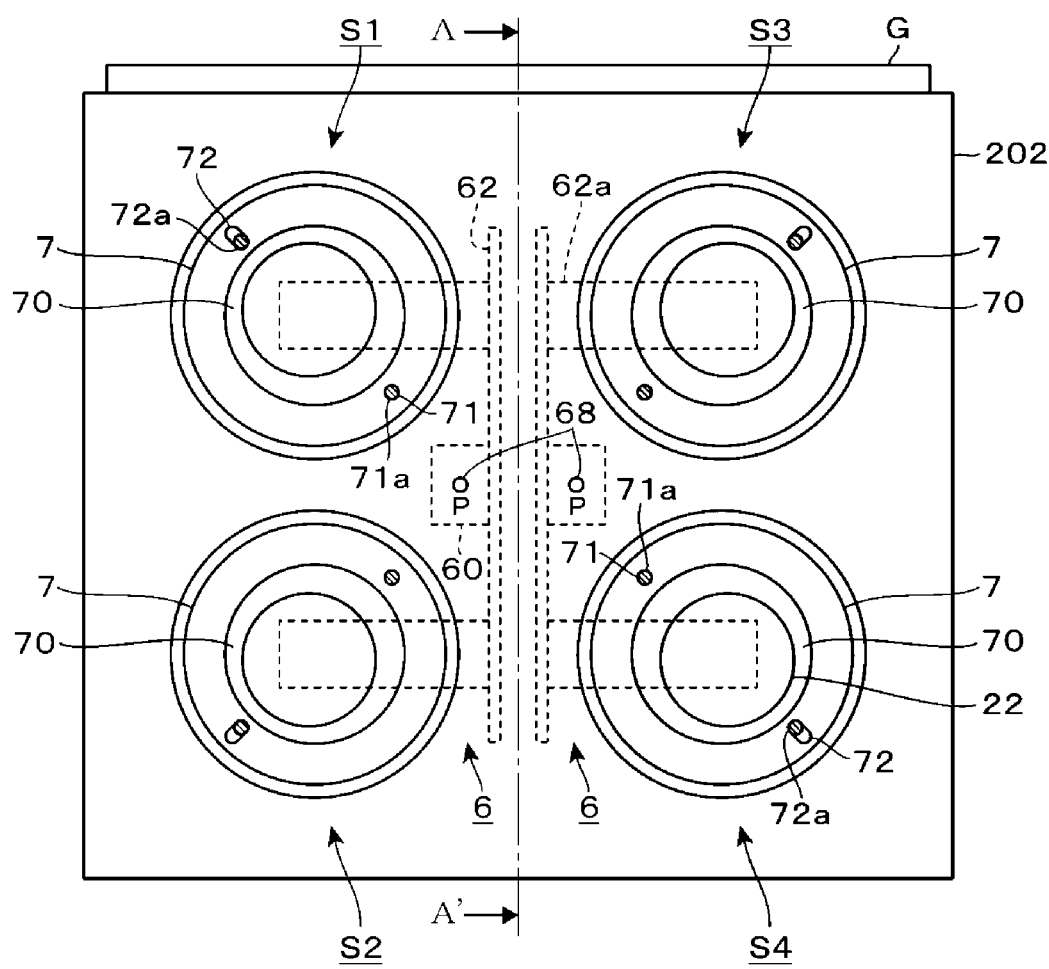
FIG. 3 is a plan view of the substrate processing apparatus.

Subsequently, an example in which the substrate processing apparatus 2 is configured as a film forming apparatus that performs a film forming processing, for example, on the wafer W by plasma chemical vapor deposition (CVD) will be described with reference to FIGS. 2 and 3. FIG. 2 is a vertical-sectional side view of the substrate processing apparatus 2, and FIG. 3 is a plan view illustrating an arrangement state of a stage 22 and a separation ring 7 (to be described later) disposed in the substrate processing apparatus 2. Particularly, FIG. 2 illustrates a state viewed from the position A-A' illustrated in FIG. 3 in an arrow direction. In FIGS. 2 and 3, sub-coordinates (X'-Y'-Z' coordinates) for explaining the arrangement relationship of the devices in the substrate processing apparatus 2 are also illustrated. In the sub-coordinates, the position connected to the vacuum transfer module 13 will be described as the front side, the X' direction will be described as the front-rear direction, and the Y' direction will be described as the left-right direction.

The substrate processing apparatus 2 of the example collectively performs a gas processing on a plurality of, for example, four wafers W in a vacuum atmosphere. The six substrate processing apparatuses 2 are configured in the same manner with each other, and the wafer W may be processed between the substrate processing apparatuses 2 in parallel with each other. The substrate processing apparatus 2 includes a rectangular processing chamber 20 viewed from plan view configured to process the wafer W placed inside. The processing chamber 20 is made of, for example, aluminum, and is configured as a vacuum container capable of evacuating the internal atmosphere.

In FIG. 2, the reference numeral 201 indicates a ceiling member of the processing chamber 20, and the reference numeral 202 indicates a container body. In the side wall at the front side of the container body 202, two carry-in/out ports 21 connected to the vacuum transfer chamber 14 via the gate valve G are formed to be arranged in the left-right direction (Y' direction). The carrying-in/out port 21 is opened/closed by the gate valve G. Further, heaters 25 serving as a heating unit that respectively heats the processing chamber 20 are embedded in the ceiling member 201 and the container body 202, and are configured to heat the inner surface of the processing chamber 20 to, for example, 170° C.

As illustrated in FIG. 3, in the processing chamber 20, two processing spaces S1 and S2 are disposed in a row from the front side to the back side on the right side when viewed from each carry-in/out port 21 (gate valve G side). Further, similarly, two processing spaces S3 and S4 are disposed in a row on the left side when viewed from the carry-in/out port 21. Therefore, when viewed from the upper surface side, a total of four processing spaces S1 to S4 are disposed in a 2×2 matrix form in the processing chamber 20. The processing spaces S1 to S4 correspond to the processing room of the embodiment.

The internal structure of the processing chamber 20 including the processing spaces S1 to S4 will be described also with reference to FIG. 2. The four processing spaces S1 to S4 are configured in the same manner with each other, and each of the processing spaces S1 to S4 is formed between the stage 22 on which the wafer W is placed and a gas supply 4 disposed to face the stage 22. FIG. 2 illustrates the vertical-sectional side surface of the processing spaces S3 and S4. Hereinafter, descriptions will be made on the processing space S3 as an example.

The stage 22 also serves as a lower electrode, and is formed in a flat disc shape containing aluminum nitride (AlN) in which, for example, a metal electrode, or a metal mesh electrode is embedded. As illustrated in FIGS. 2 and 3, the stage 22 is supported by the support 6. As illustrated in FIG. 3, the substrate processing apparatus 2 according to the present disclosure is provided with two supports 6, that is, a support 6 that supports the stages 22 provided in the processing spaces S1 and S2, and a support 6 that supports the stages 22 provided in the processing spaces S3 and S4. The two supports 6 are configured to be mirror-symmetrical to each other with respect to the X'-Z' plane. Here, descriptions will be made on the support 6 that supports the stages 22 provided in the processing spaces S3 and S4 as an example.

The support 6 includes a base 60 fixed to the vicinity of the center of the lower surface of the processing chamber 20. The base 60 is fixed to the processing chamber 20 by, for example, a fastening pin 68. The position of the fastening pin 68 at which the processing chamber 20 and the support 6 are fixed becomes a reference position P for the two stages 22 supported by the support 6 and the stage peripheral member (to be described later). An insulating member is disposed in the contact portion between the base 60 and the processing chamber 20 to thermally isolate the processing chamber 20 side and the support 6 side.

Two guide rails 65 extending in the vertical direction are formed on the right side surface of the base 60 when viewed from the carry-in/out port 21 side (gate valve G side). Further, an arm 62 horizontally provided in the front-rear direction is configured to move up and down along the guide rails 65. The guide rails 65 and the arm 62 constitute an elevating mechanism.

Beam portions 62a extending from the arm 62 to the lower part of the stages 22 provided in the processing spaces S3 and S4 are provided at positions near both ends of the arm 62. A support column 61 extending upward is provided at the tip of each beam portion 62a. The support column 61 penetrates the bottom surface of the processing chamber 20, and the stage 22 that holds the wafer W is respectively provided on the top of the support column 61. Each stage 22 is inserted into an opening 204 formed in the lower surface of the processing spaces S3 and S4 and is in a state where the wafer W is held in the processing spaces S3 and S4 (FIG. 2).

According to the configuration of the support 6 described above, the base 60 fixed to the processing chamber 20 supports the stage 22 such that the stage 22 is inserted into the opening 204 in the processing spaces S3 and S4 at a position distant from the reference position P in the horizontal direction (FIG. 3). Further, below the processing chamber 20, a bellows 63 configured to keep the inside of the processing chamber 20 to be airtight is provided so as to surround the support column 61. The arm 62 moves up and down by the support 6 configured as described above, and the stage 22 moves up and down in the processing chamber 20. Further, a rotation drive mechanism may be provided at the base end portion of the support column 61 so as to configure the stage 22 to be rotatable around the vertical axis.

In FIG. 2, the stage 22 at a processing position is illustrated by the solid line, and the stage 22 at a transport position is illustrated by the dotted line, respectively. The processing position is a position at which a substrate processing (film forming processing) (to be described later) is performed, and each stage 22 is in a state of being inserted into the opening 204 formed in the lower surface of the processing spaces S3 and S4. The transport position is s position at which the wafer W is transported between the substrate transfer mechanism 15 and the stage 22 described above. That is, the elevating mechanism of the support 6 moves the stage 22 up and down between the transport position of the support in the lower side of the processing spaces S3 and S4 and the processing position of the substrate on the upper side of the processing spaces S3 and S4 by moving the stage 22 up and down with respect to the base 60. The reference numeral 24 in FIG. 2 indicates a heater respectively embedded in the stages 22, which heats each wafer W placed on the stage 22 to 50° C. to 600° C. Further, the stage 22 is grounded via a matcher (not illustrated).

Further, the support 6 includes a flow path (not illustrated) therein, and the support 6 is configured to be cooled by passing cooling water supplied from a cooling mechanism 67 such as a chiller through the flow path. The flow path is formed in the base 60, the arm 62, the beam portion 62a, and the support column 61, respectively, and each component is configured to be cooled.

Further, in the bottom surface in the processing chamber 20, a plurality of, for example, three transport pins (not illustrated) are provided at positions corresponding to the stage 22, and penetrating holes (not illustrated) for forming passing areas for the transport pins are formed in the stage 22.

Further, in the ceiling member 201 of the processing chamber 20, a gas supply 4 that forms an upper electrode via a guide member 34 (to be described later) including an insulating member is provided above the stage 22. The gas supply 4 includes a lid body 42, a shower plate 43 that forms a facing surface provided to face the placing surface of the stage 22, and a gas flowing chamber 44 formed between the lid body 42 and the shower plate 43. The lid body 42 is connected to a gas distribution path 51, and, in the shower plate 43, gas ejection holes 45 penetrating the shower plate 43 in the thickness direction are arranged vertically and horizontally to eject a gas in a shower shape toward the stage 22.

The upstream side of the gas distribution path 51 connected to the gas supply 4 in each of the processing spaces S1 to S4 is joined to a common gas supply path 52 and is connected to a gas supply system 53. The gas supply system 53 includes, for example, a supply source of a reaction gas (processing gas), a supply source of a purge gas, a supply source of a cleaning gas that removes a film deposited in the processing chamber 20, a pipe, a valve, and a flow rate adjustor.

Further, a radio-frequency power source 41 is connected to the shower plate 43 via a matcher 40. When a radio-frequency power is applied between the shower plate (upper electrode) 43 and the stage (lower electrode) 22, the gas (in the example, reaction gas) supplied to the processing space S3 from the shower plate 43 may be formed into plasma by capacitive coupling. The shower plate 43 connected to the radio-frequency power source 41, and the grounded stage 22 correspond to a plasma forming unit of the embodiment.

In the periphery of each of the processing spaces S1 to S4, an annular guide member 34 is provided to form an exhaust port along the circumferential direction of the processing spaces S1 to S4. The guide member 34 is fitted into the periphery of the gas supply 4 to form a flowing path 35 through which the gas discharged from the processing spaces S1 to S4 passes. An exhaust port (not illustrated) is formed in the flowing path 35, and the inside of the substrate processing apparatus 2 is evacuated through an exhaust flow path (not illustrated) connected to the exhaust port.

Further, below each stage 22 in the processing chamber 20, a gas supply 26 that supplies an inert gas such as argon (Ar) gas to the space below the stage 22 is provided, in order to prevent the reaction gas from flowing below the stage 22. The reference numeral 27 in FIG. 2 indicates an Ar gas supply source.

Further, a flat shelf 203 that surrounds the periphery of the stage 22 is formed below the guide member 34 in the container body 202. Then, the shelf 203 is provided with the separation ring 7 that is an annular member surrounding the periphery of the stage 22 at the processing position. The separation ring 7 corresponds to the stage peripheral member provided in the processing chamber 20 along the periphery of the stage 22. The separation ring 7 is provided corresponding to each stage 22 disposed in the plurality of processing spaces S1 to S4.

The separation ring 7 narrows the width of the gap formed with the periphery of the stage 22 during the processing of the wafer W to partition the atmosphere above the stage 22 and the atmosphere below the stage 22. A sufficient distance is secured between the outer peripheral surface of the separation ring 7 placed on the shelf 203 and the member that constitutes the processing chamber 20 (container body 202). As a result, as described in the description of the operation (to be described later), even when the positional relationship with the separation ring 7 is changed according to the expansion and the contraction of the processing chamber 20, the outer peripheral surface of the separation ring 7 is disposed so as not to come into contact with other members.

Figure 4:
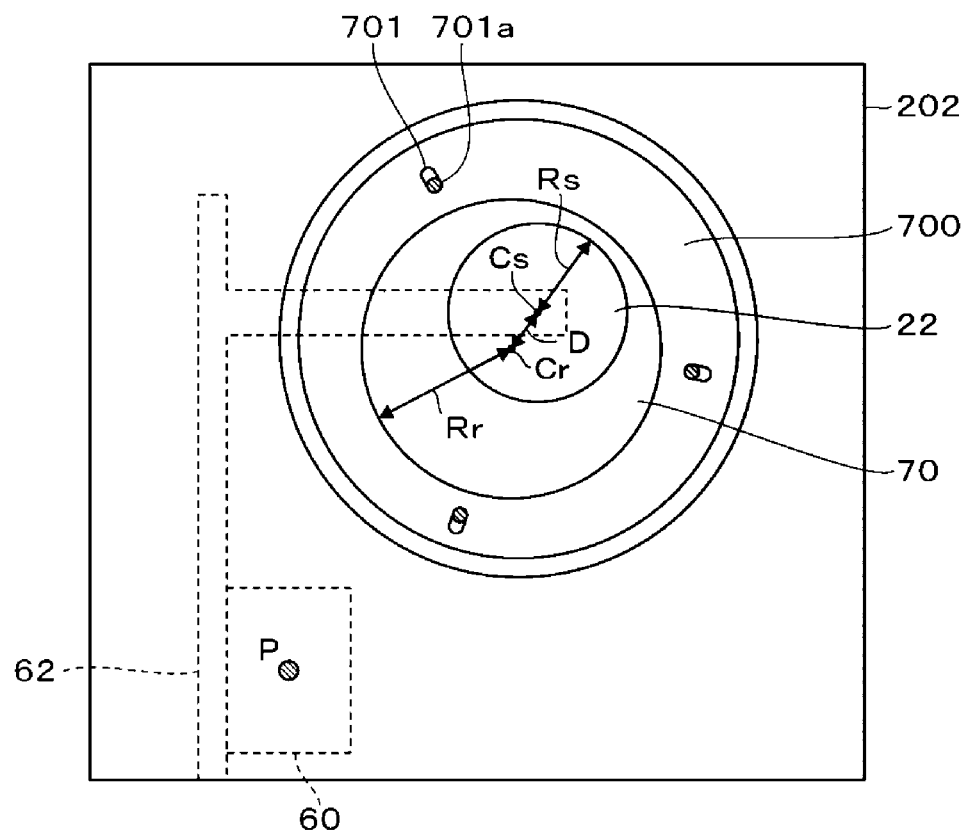
FIG. 4 is an explanatory view of a separation ring according to a comparative embodiment provided in the substrate processing apparatus.
Figure 5:
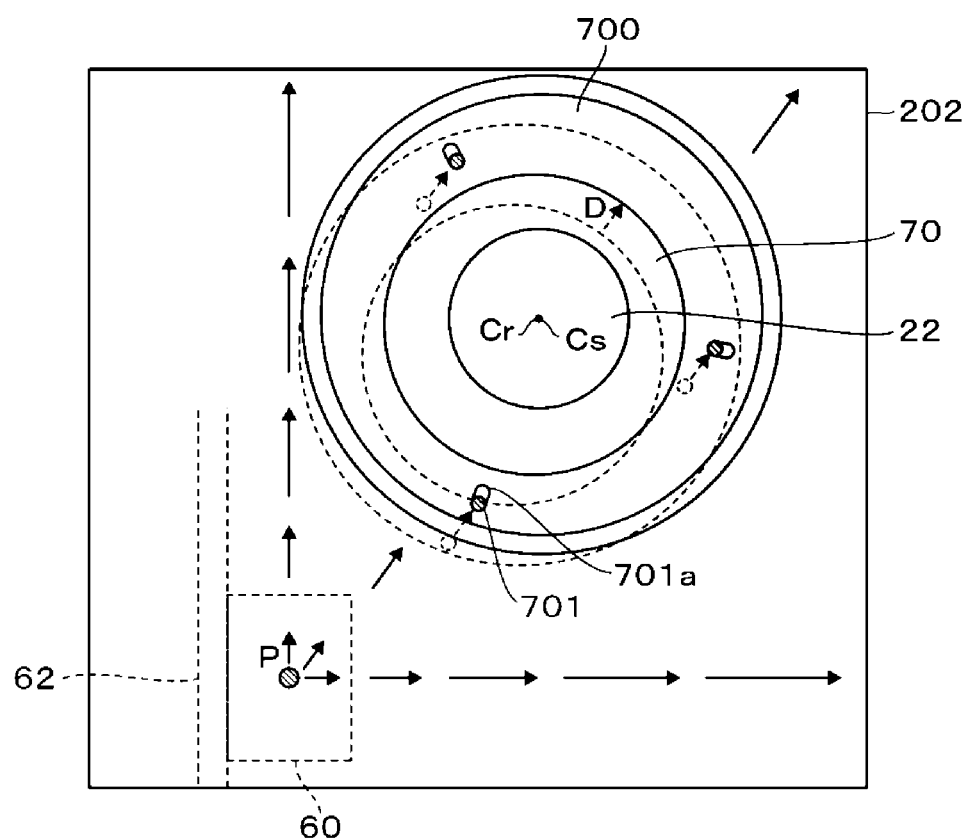
FIG. 5 is an explanatory view of the separation ring according to the comparative embodiment provided in the substrate processing apparatus.

In the substrate processing apparatus 2 having the above described configuration, problems in the related art when the stage peripheral member provided in the periphery of the stage 22 like the separation ring 7 will be described with reference to a separation ring 700 according to a comparative embodiment. FIGS. 4 and 5 respectively illustrate the positional relationship between the separation ring 700 according to the comparative embodiment and the stage 22 in the unheated state and the heated state of the processing chamber 20. In FIG. 5 and FIG. 7 which illustrates the separation ring 7 according to the present disclosure (to be described later), the illustration of the arm 62 is partially omitted in order to avoid complicating the drawings. Further, in FIGS. 4 to 7, the width of the separation rings 7 and 700, and the dimension of the gaps between the separation rings 7 and 700 and the stage 22 are exaggerated.

The separation ring 700 is made of, for example, alumina, and is configured in a flat annular shape surrounding the periphery of the stage 22 at the processing position. In the comparative embodiment, positioning pins 701a that position the separation ring 700 are provided on the shelf 203 along the circumferential direction of the stage 22, for example, at three locations at equal intervals. Further, a hole 701 corresponding to each positioning pin 701a is formed in the separation ring 700. Then, the corresponding positioning pin 701a is inserted into each hole 701, and thus, the separation ring 700 is positioned so as to surround the periphery of the stage 22 at the processing position. This method is similar to the method of attaching a shadow ring to an adapter ring using a pin disclosed in Japanese Patent Laid-Open Publication No. 10-321524.

Each hole 701 is configured as an elongated hole extending in the radial direction of the separation ring 700, and even when the distance between the three positioning pins 701a deviates from the design dimension, each positioning pin 701a may be securely inserted into each hole 701, and the separation ring 700 may be fixed to the processing chamber 20.

Here, in the substrate processing apparatus 2 of the example, when the apparatus is not operated, the temperature of the processing chamber 20 is approximately a room temperature (23° C.). Meanwhile, the apparatus is operated, the processing chamber 20 is heated to, for example, 170° C., in order to suppress the adsorption of the raw gas onto the inner surface of the processing chamber 20. Therefore, as described above, the processing chamber 20 made of aluminum thermally expands in the heated state as compared with the unheated state.

With regard to this, the stage 22 and the support 6 that supports the stage 22 are thermally isolated from the processing chamber 20 as described above, and are cooled by the cooling water flowing therein, in order to protect, for example, a seal member or a motor from heat. Therefore, when the heating chamber 20 is heated and the temperature is increased, the temperature of the support 6 is hardly changed and the thermal expansion hardly occurs.

As a result, when the relative positions of the processing chamber 20 and the support 6 are considered, the reference position P is not changed in the heated state and the unheated state of the processing chamber 20 since the base 60 portion and the processing chamber 20 are fixed by the fastening pin 68. Further, when the unheated state is switched to the heated state, the processing chamber 20 constantly expands, and thus, when viewed from the reference position P, the position of the member disposed at a position distant from the reference position P is shifted to be radially distant from the reference position P.

Meanwhile, the position of the support 6 or the stage 22, which is cooled by the cooling water and the temperature is hardly changed when the processing chamber 20 is in the heated state, is not changed at any sides when viewed from the reference position P.

Therefore, when focusing on the positional relationship between the member on the processing chamber 20 side including the separation ring 700 and the stage 22, when viewed from the stage 22, the member on the processing chamber 20 side moves to be distant in the radial direction from the reference position P when the processing chamber 20 is heated.

As described above, a further problem occurs when the positional relationship between the separation ring 700 and the stage 22 is changed by switching the processing chamber 20 from the unheated state to the heated state.

As described above, in order to partition the atmosphere above the stage 22 and the atmosphere below the stage 22, the stage 22 is disposed inside an opening portion 70 of the separation ring 700 at the processing position. Meanwhile, it is necessary to configure the stage 22 and the separation ring 700 so as not to come into contact with each other regardless of whether the processing chamber 20 is in the unheated state and the heated state.

From the viewpoint of partitioning the atmosphere above and below the stage 22, it is desirable that the dimension of the gap between the outer peripheral surface of the stage 22 and the inner peripheral surface of the separation ring 700 at the processing position is uniform over the entire circumference. Meanwhile, as described above, the positional relationship between the stage 22 and the separation ring 700 is changed between the unheated state and the heated state. Since the processing of the wafer W is performed when the processing chamber 20 is in the heated state, it is desirable that, under this condition, the center $C_r$ of the opening portion 70 of the separation ring 700 is aligned with the center $C_s$ of the stage 22 (FIG. 5).

When the processing chamber 20 is in the heated state, as a method for aligning the center $C_r$ of the opening portion 70 of the separation ring 700 and the center $C_s$ of the stage 22, a method in which any one of the center $C_s$ of the stage 22 and the center $C_r$ of the opening portion 70 in the unheated state is eccentrically disposed may be considered. In the example, the center $C_r$ of the opening portion 70 is formed to be eccentric with respect to the center of the body of the separation ring 700.

For example, as illustrated in FIG. 5, the extent of the positional shift of the separation ring 700 between the unheated state and the heated state of the processing chamber 20 is referred to as a "positional shift dimension D." The positional shift dimension D is grasped in advance, and in the unheated state of the processing chamber 20, the center $C_r$ of the opening portion 70 is formed at a position shifted by the positional shift dimension D toward the reference position P, with respect to the center $C_s$ of the stage 22. With this arrangement, when the processing chamber 20 is in the heated state, the center $C_r$ of the separation ring 700 is moved toward the center $C_s$ side of the stage 22, and, eventually, the centers $C_s$ and $C_r$ are aligned with each other.

Meanwhile, when the opening portion 70 of the separation ring 700 is eccentrically formed as described above, it is necessary to adjust the inner diameter of the opening portion 70 such that the stage 22 and the separation ring 700 are not brought into contact with each other in the unheated state. Theoretically, when the inner diameter $R_r$ of the opening portion 70 satisfies the condition of "$R_r > D + R_s$ ($R_s$=radius of the stage 22)," the contact between these members may be avoided, but it is necessary to consider margin m for compensating, for example, processing tolerance of each member in designing ($R_r > D + R_s + m$).

As described above, when the positional shift dimension D is grasped in advance, and the opening portion 70 is formed to be eccentric with respect to the separation ring 700, in the heated state in which the wafer W is processed, the center $C_r$ of the opening portion 70 and the center $C_s$ of the stage 22 may be aligned with each other, and the uniform gap may be formed over the entire circumference of the stage 22.

Meanwhile, when the positional shift dimension D due to the movement of the separation ring 700 between the unheated state and the heated state is large, the width of the gap is widened, and thus, the effect of partitioning the atmosphere above and below the stage 22 is decreased.

With regard to this aspect, the separation ring 700 according to the comparative embodiment is positioned using the positioning pins 701a provided at three locations at equal intervals as described above. However, when the separation ring 700 is attached using this method, the influence when the positioning pin 701a disposed at the farthest position viewed from the reference position P is moved according to the expansion of the processing chamber 20 is increased. As a result, as will be described later, the positional shift dimension D is increased (1 mm in Comparative Example described later). In this case, assuming that the margin is 0.5 mm, when the stage 22 is positioned at the processing position, the gap having a width as wide as 1.5 mm is formed between the stage 22 and the separation ring 700.

With regard to such problems, the separation ring 7 in the substrate processing apparatus 2 according to the present disclosure is to set the width of the gap including the margin to, for example, 1 mm or less. In order to achieve this, it is necessary to decrease the positional shift dimension D of the separation ring 7 corresponding to the change of the state between the unheated state and the heated state to, for example, 0.5 mm or less.

Figure 6:
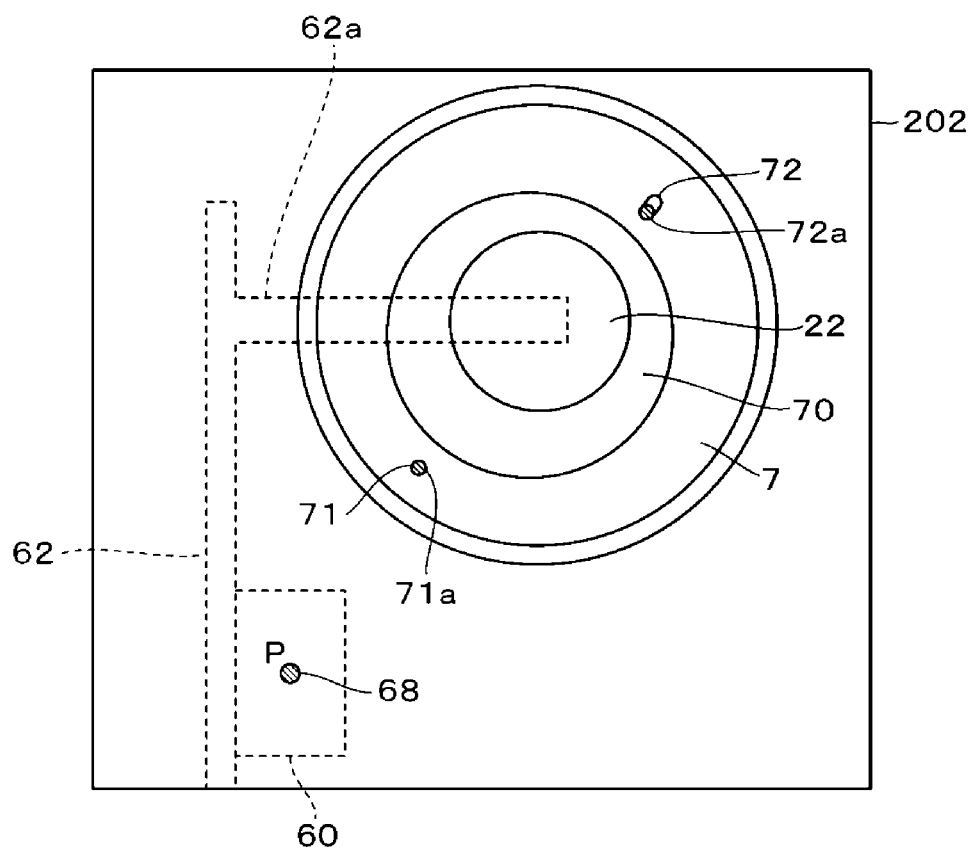
FIG. 6 is an explanatory view of a separation ring according to the present disclosure.
Figure 7:
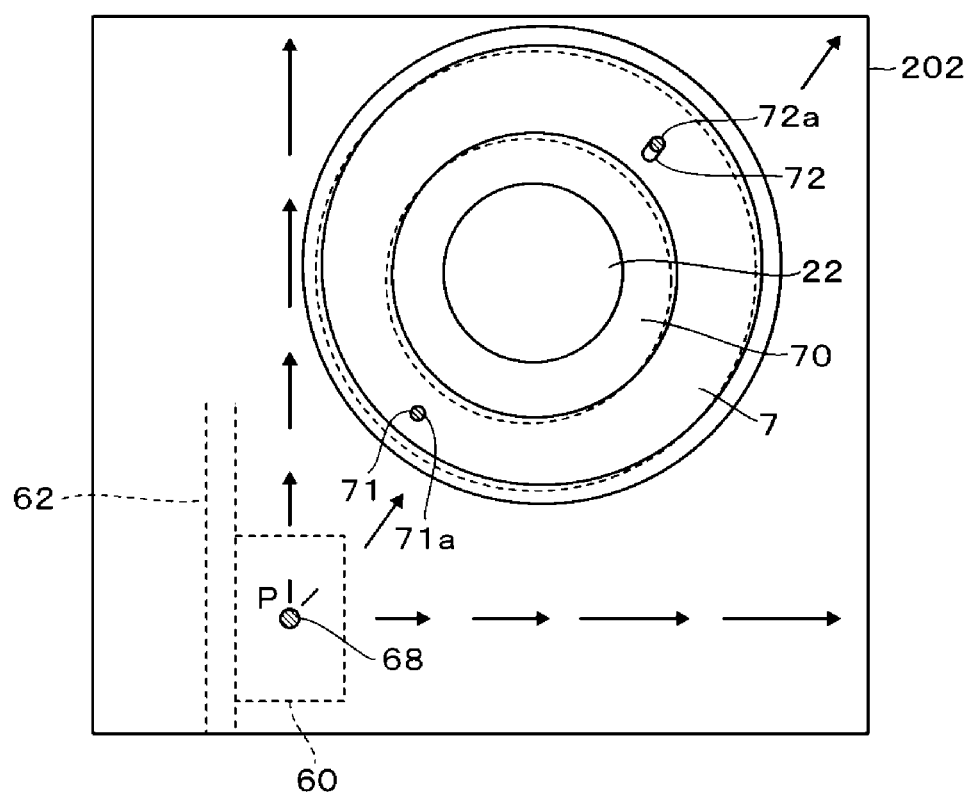
FIG. 7 is an explanatory view of the separation ring according to the present disclosure.

FIGS. 6 and 7 respectively illustrate the positional relationship between the separation ring 7 according to the present disclosure and the stage 22 in the unheated state and the heated state of the processing chamber 20. As illustrated in FIGS. 6 and 7, the substrate processing apparatus 2 includes a first positioning pin 71a and a second positioning pin 72a having a circular cross section and respectively fixed to the processing chamber 20 in order to position the separation ring 7.

When viewed from plan view, the first positioning pin 71a is provided at a position as close as possible to the reference position P of the separation ring 7 formed in an annular shape. With regard to this, the second positioning pin is provided at a position farther than the first positioning pin 71a when viewed from the reference position P, for example, at a position facing the first positioning pin 71a through the opening portion 70. In the present disclosure, the spaced distance from the reference position P to the first positioning pin 71a is 60 mm when viewed from plan view (X'-Y' plane).

Further, the separation ring 7 according to the present disclosure is characterized by the shape of holes 71 and 72 into which the each of pins 71a and 72a is inserted. That is, the first hole 71 into which the first positioning pin 71a is inserted is configured as a circular hole corresponding to the cross section shape of the first positioning pin 71a. Meanwhile, the second hole 72 into which the second positioning pin 72a is inserted is configured as an elongated hole in which the second positioning pin 72a is movable.

The inner diameter of the first hole 71 is set, for example, to be matched to the outer diameter of the cross section of the first positioning pin 71a. In this manner, the position of the separation ring 7 with respect to the processing chamber 20 may be fixed by configuring the first positioning pin 71a so as not to move in the first hole 71. That is, the first positioning pin 71a is inserted into the first hole 71, and when the processing chamber 20 expands and contracts by switching between the unheated state and the heated state of the processing chamber 20, the first hole 71 suppresses the separation ring 7 so as not to be positionally shifted largely in the horizontal direction with respect to the processing chamber 20.

Further, the second positioning pin 72a is inserted into the second hole 72, and the second hole 72 is formed in an elongated hole shape along the direction in which the second positioning pin 72a moves when the processing chamber 20 expands and contracts by switching between the unheated state and the heated state of the processing chamber 20. In the example, when the processing chamber 20 is not heated, the second positioning pin 72a is positioned at an end portion on the most reference position P side of the second hole 72.

By having the configuration described above, the position of the separation ring 7 according to the present disclosure is shifted only by the first positioning pin 71a close to the reference position P among the two holes 71 and 72. Since the first positioning pin 71a has a relatively small positional shift dimension from the reference position P, the positional shift dimension D of the separation ring 7 is suppressed to be small.

Meanwhile, the second positioning pin 72a having a large shift amount due to the expansion of the processing chamber 20 is disposed in the second hole 72 having an elongated hole shape formed in the moving direction of the second positioning pin 72a. As a result, even when the second positioning pin 72a is moved when the processing chamber 20 is in the heated state, the force for moving the separation ring 7 does not act, and only the shift of the separation ring 7 in the rotation direction is suppressed.

Descriptions will be made on the processing of the wafer W in the substrate processing system 1 having the configuration described above.

When the carrier C accommodating the wafer W that is a processing target is placed on the carry-in/out port 11, the wafer W is received under a normal pressure atmosphere by the transfer mechanism 120 of the carry-in/out module 12, and is transferred into the load-lock chamber 122. Subsequently, the inside of the load-lock chamber 122 is switched from a normal pressure atmosphere to a vacuum atmosphere, and then, the wafer W in the load-lock chamber 122 is received by the substrate transfer mechanism 15 in the vacuum transfer module 13, and is transferred to a predetermined substrate processing apparatus 2 through the vacuum transfer chamber 14. The processing chamber 20 is heated to, for example, 170° C.

Subsequently, the first and the second substrate holders 161 and 162 are retracted from the substrate processing apparatus 2, and the gate valve G is closed. Subsequently, each stage 22 is raised to the processing position, and Ar gas is supplied to the space below the stage 22.

Further, the wafer W is heated by pressure adjustment in the processing chamber 20 and the heater 24. Thereafter, a film forming reaction gas is supplied from each gas supply 4 to each of the processing spaces S1 to S4, and each radio-frequency power source 41 is turned ON to form the reaction gas into plasma, thereby performing the film forming processing.

At this time, the reaction gas is ejected in a shower shape to the wafer W disposed on the stage 22 in each of the processing spaces S1 to S4 through the shower plate 43. Thereafter, the reaction gas flows in the radial direction on the surface of the wafer W, and then, flows into the flowing path 35 opened in the side circumferential portion of the processing spaces S1 to S4, and is exhausted.

As described above, in the substrate processing apparatus 2 according to the present disclosure, since the positional shift dimension D of the separation ring 7 may be decreased, the inner diameter of the opening portion 70 may be also decreased, and the gap between the peripheral edge of the stage 22 and the separation ring 7 becomes narrow as compared with that of the separation ring 700 according to the comparative embodiment.

Figure 8:
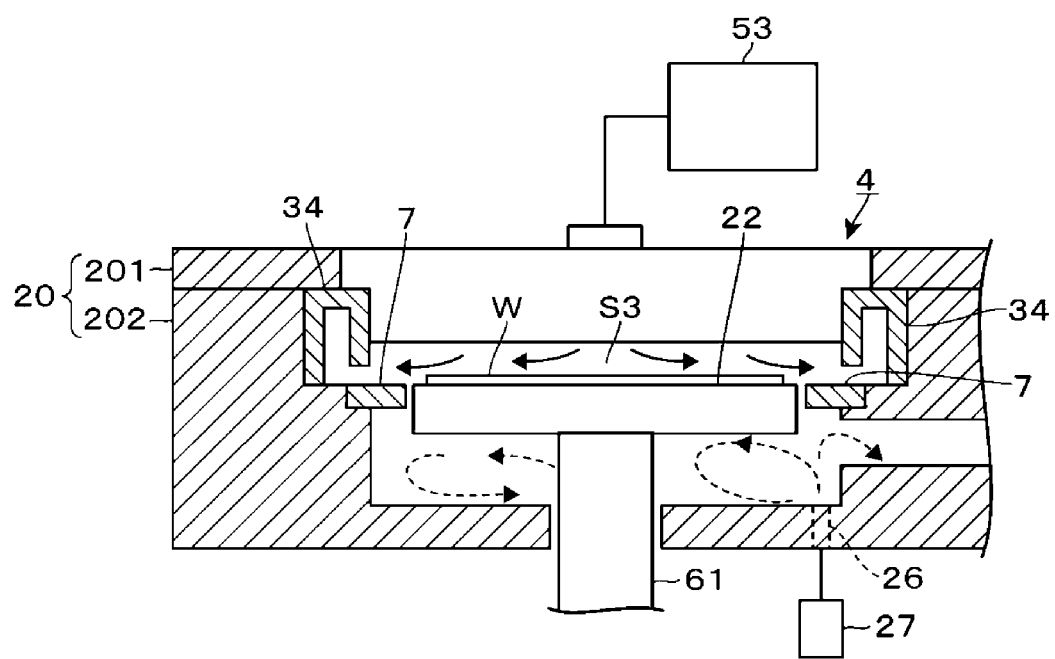
FIG. 8 is an explanatory view illustrating an operation of the substrate processing apparatus.

As a result, as illustrated in FIG. 8, it is difficult for the reaction gas supplied to the processing spaces S1 to S4 side to enter the gap between the stage 22 and the separation ring 7, and thus, it is difficult for the reaction gas to wrap around below the stage 22 (FIG. 8 illustrates the processing space S3). Further, since it is difficult for the reaction gas to wrap around below the stage 22, the flow rate of the Ar gas supplied below the stage 22 may be suppressed. Therefore, it is difficult for the Ar gas to wrap around above the stage 22, and thus, the processing gas may be suppressed from being diluted by the Ar gas.

Further, the plasma is suppressed from wrapping around below the stage 22 through the gap between the stage 22 and the separation ring 7 even when the radio-frequency power source 41 is turned ON to form plasma, and thus, the discharge below the stage 22 may be suppressed. It is known that the gap dimension between the stage 22 and the separation ring 7 for securely suppressing plasma from wrapping around is 0.5 mm. As will be described later, it is grasped that the positional shift dimension D of the separation ring 7 may be suppressed to 0.2 mm. From this, by setting the margin m for securely avoiding contact between the stage 22 and the separation ring 7 to 0.3 mm or less, the gap dimension between the stage 22 and the separation ring 7 during the processing of the wafer W may be set to 0.5 mm or less.

Then, when a predetermined time is elapsed and the film formation is completed, the supply of the reaction gas and the radio-frequency power is stopped, and the pressure in the processing chamber 20 is adjusted, and then, the wafers W after the film forming processing are simultaneously carried out from the processing chamber 20 in the reverse procedure of the carry-in procedure.

In this manner, in the substrate processing apparatus 2 according to the present disclosure, when the stage peripheral member (separation ring 7) is provided in the processing chamber 20, the stage peripheral member is fixed to the processing chamber 20 by the first positioning pin 71a disposed at a position close to the reference position P. Meanwhile, the second positioning pin 72a at the position farther than the first positioning pin 71a when viewed from the reference position P is inserted into the second hole 72 formed in an elongated hole shape along the direction in which the second positioning pin 72a moves. With this configuration, the positional shift of the stage peripheral member when the processing chamber 20 is switched from the unheated state to the heated state is suppressed to approximately the movement amount of the first positioning pin 71a, and the positional shift dimension D may be decreased.

Further, when the stage peripheral member is the separation ring 7, the positional shift dimension D of the separation ring 7 when the processing chamber 20 is switched between the unheated state and the heated state is decreased, and thus, the inner diameter of the opening portion 70 of the separation ring 7 may be decreased. Therefore, the gap between the stage 22 and the separation ring 7 during the processing of the wafer W may be decreased, and thus, the space above the stage 22 and the space below the stage 22 may be further securely partitioned.

Here, the technology according to the present disclosure is not limited to the case the technology is applied to the substrate processing apparatus 2 that processes a plurality of wafers W at the same time. For example, one wafer W may be placed on one stage 22 provided in the processing chamber 20 to perform the processing. In the substrate processing apparatus 2, it is applicable as long as the stage 22 is supported at a position distant in the horizontal direction from the reference position P at which the support 6 is fixed to the processing chamber 20.

Figure 9:
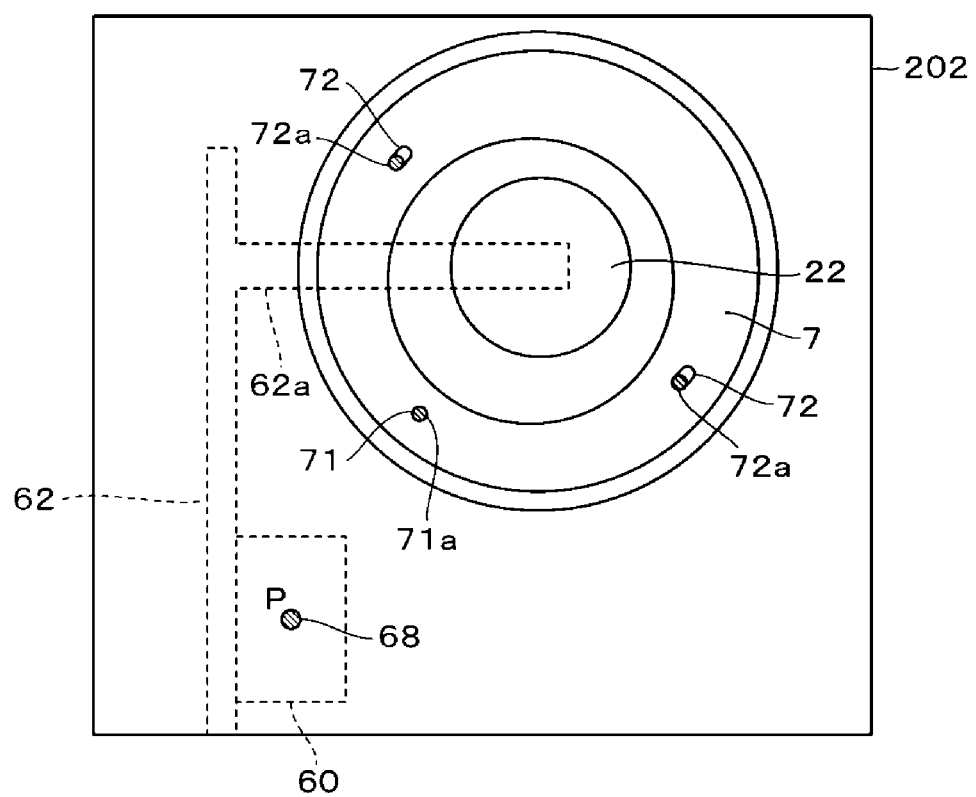
FIG. 9 is a plan view illustrating another example of a separation ring.

Further, as illustrated in FIG. 9, a plurality of pairs of the second hole 72 and the second positioning pin 72a may be provided as a variation of the second positioning pin 72a and the second hole 72. Further, the stage peripheral member may not be an annular member. For example, two of two semi-circular shape stage peripheral members may be combined to surround the stage 22. The stage 22 supported by the support 6 may not be moved up and down. The stage 22 may be fixedly disposed at the height position surrounded by the stage peripheral member to configure the processing spaces S1 to S4, and the carry-in/out port may be provided in the processing spaces S1 to S4 to directly carry in/out the wafer W.

Further, the first hole 71 and the first positioning pin 71a may be configured such that the center of the first hole 71 and the center of the first positioning pin 71a inserted into the first hole 71 is not shifted from each other. As a result, the cross section of the first hole 71 and the first positioning pin 71a is not limited to a circular shape, and, for example, the cross section may have a polygonal shape.

Figure 10:
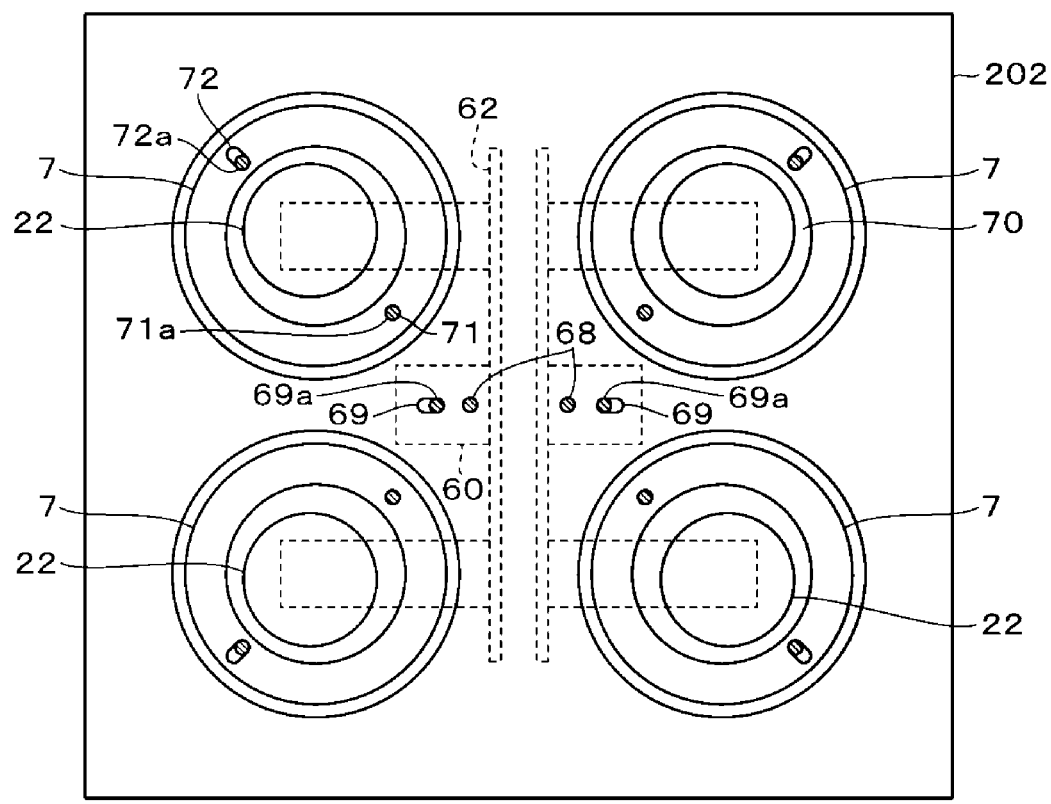
FIG. 10 is a plan view illustrating another example of a support that supports a stage.
Figure 11:
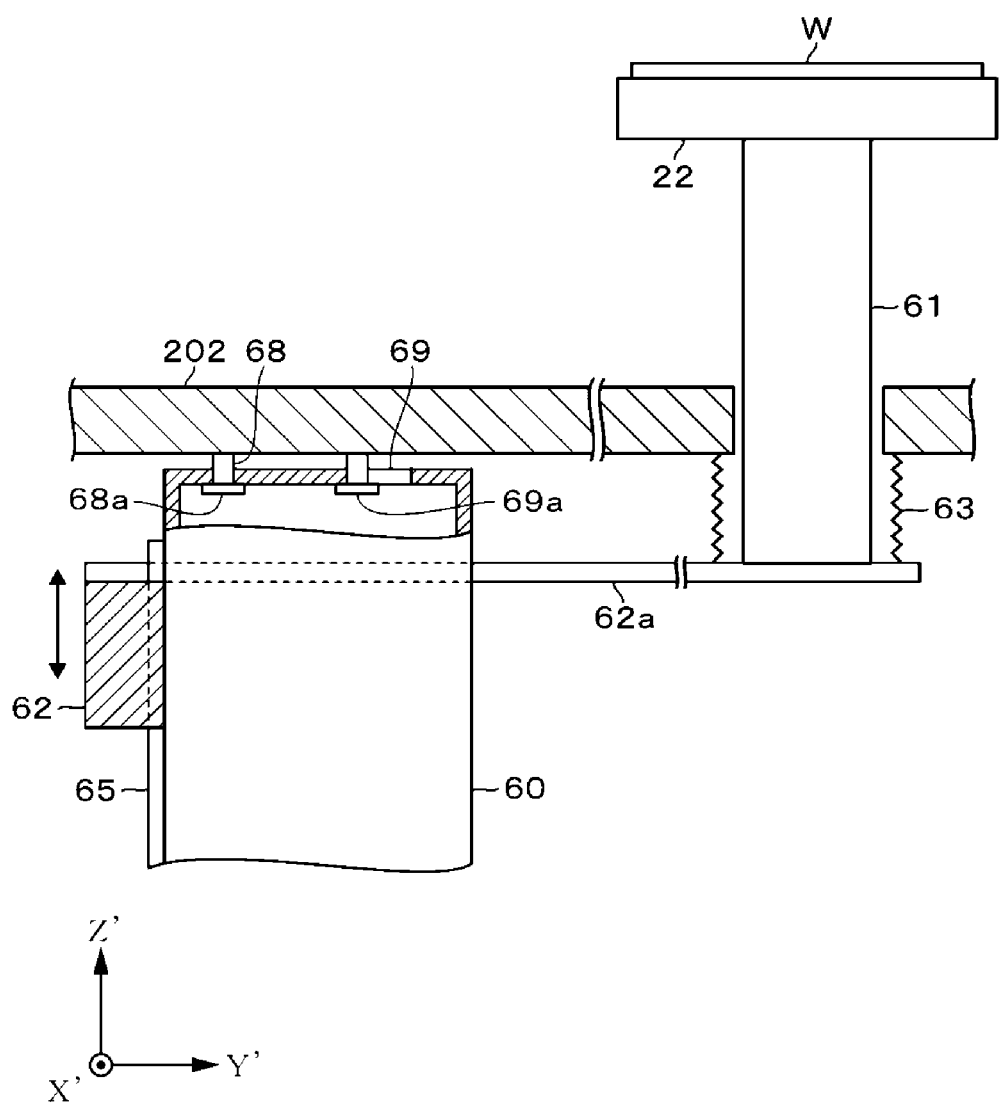
FIG. 11 is a side view of a support according to another example.

Further, as illustrated in FIGS. 10 and 11, when fixing the base 60 to the processing chamber 20, the substrate processing apparatus 2 according to the present disclosure may further fix the base 60 to the processing chamber 20 other than the fixing at the reference position P. When the processing chamber 20 and the support 6 are fixed to each other at a plurality of locations, stress may be applied to the support 6 side when the processing chamber 20 is switched between the unheated state and the heated state, and distortion may occur.

For example, in the example illustrated in FIGS. 10 and 11, the base 60 is fixed to the processing chamber 20 at the reference position P. Further, a fastening pin 69a fixed to the processing chamber 20 is inserted into a hole 69 formed at a position distant from the reference position P of the base 60 to attach the base 60 to the processing chamber 20. At this time, the hole (fastening hole) 69 on the base 60 side into which the fastening pin 69a is inserted is configured as an elongated hole. The hole 69 is formed along the direction in which the fastening pin 69a moves due to the expansion and the contraction of the processing chamber 20 when the processing chamber 20 is switched between the unheated state and the heated state. By configuring in this manner, when the processing chamber 20 expands, load is not applied to the base 60 from the fastening pin 69a at a position shifted from the reference position P, and thus, distortion of the support 6 may be suppressed.

Second Embodiment

A second embodiment of the substrate processing apparatus according to the present disclosure will be described. In the second embodiment, the gap around the stage 22 positioned at the processing position of the wafer W is configured to be a labyrinth structure.

Figure 12:
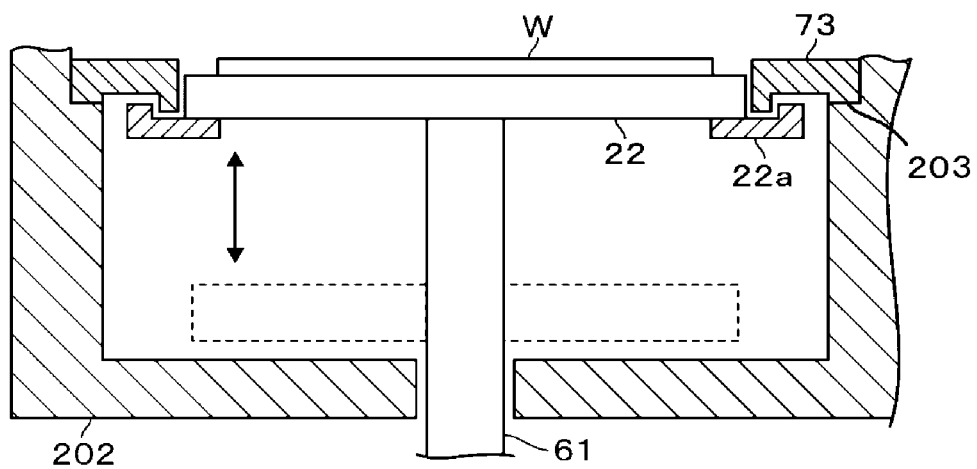
FIG. 12 is a cross-sectional view of a substrate processing apparatus according to a second embodiment.

For example, as illustrated in FIG. 12, on the lower surface of the stage 22, a bent member 22a that is configured in an annular shape along the peripheral edge of the stage 22, horizontally projects in the outer peripheral direction of the stage 22, and includes a peripheral edge bent upward is provided. Then, an annular labyrinth member 73 formed to be combined above the bent member 22a and correspond to the shape of the side surface of the stage 22 is provided on the upper surface of the shelf 203, instead of the separation ring 7. The labyrinth member 73 forms a gap having a labyrinth structure with the bent member 22a. When the labyrinth member 73 is provided in the processing chamber 20, a method is used similar to the separation ring 7 illustrated in FIGS. 6 and 7 (illustration of the first positioning pin 71a, and the first hole 71, and the second positioning pin 72a and the second hole 72 is omitted in FIG. 12). With this configuration, a relative positional shift of the labyrinth member 73 with respect to the stage 22 in the unheated state and the heated state of the processing chamber 20 may be decreased.

Then, since the position of the labyrinth member 73 is not shifted largely due to the heating of the processing chamber 20, the gap of the labyrinth formed between the labyrinth member 73 and the bent member may be narrowed. The labyrinth member 73 corresponds to the stage peripheral member of the embodiment.

Third Embodiment

A substrate processing apparatus according to a third embodiment will be described. The substrate processing apparatus includes a shadow ring 74 that covers the peripheral edge portion of the wafer W to suppress the peeling of the film on the peripheral edge portion of the wafer W.

Figure 13:
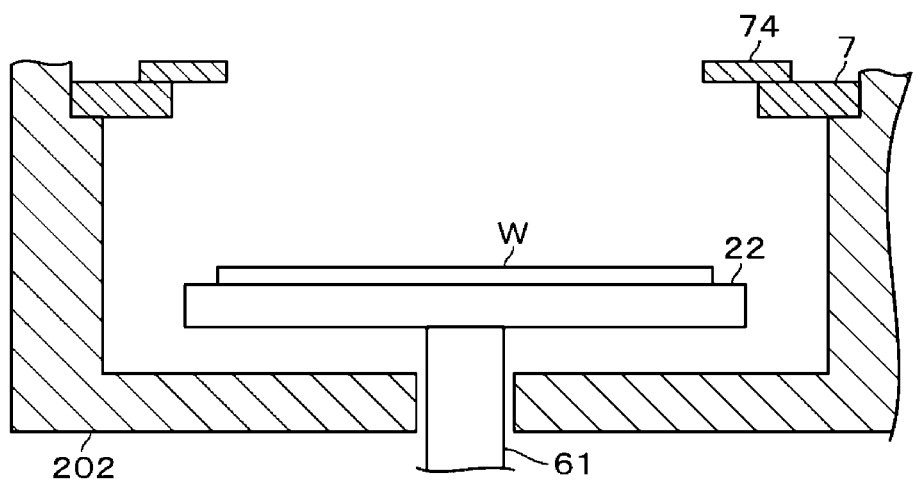
FIG. 13 is a cross-sectional view of a substrate processing apparatus according to a third embodiment.
Figure 14:
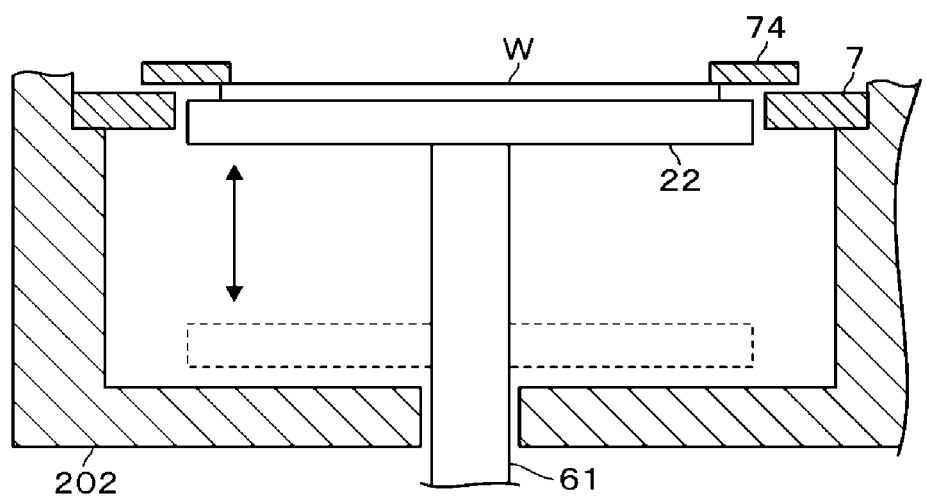
FIG. 14 is a cross-sectional view of a substrate processing apparatus according to the third embodiment.

As illustrated in FIG. 13, the shadow ring 74 is an annular member having a size such that the inner peripheral edge is brought into contact with the peripheral edge of the wafer W, and, when the stage 22 is lowered, is placed on the separation ring 7 serving as the stage peripheral member illustrated in the first embodiment. Then, when the stage 22 is raised, as illustrated in FIG. 14, the inner peripheral side area of the shadow ring 74 is placed to cover the peripheral edge portion of the wafer W and is lifted by the stage 22.

Also in the substrate processing apparatus 2 including the shadow ring 74, since the shadow ring 74 is disposed on the separation ring 7, when the processing chamber 20 is heated and the processing chamber 20 thermally expands, the relative position of the shadow ring 74 with respect to the stage 22 is shifted together with the separation ring 7.

In the substrate processing apparatus 2 according to the present disclosure, the shift amount of the separation ring 7 in the unheated state and the heated state of the processing chamber 20 may be suppressed to be small. As a result, the positional shift error of the shadow ring 74 by the processing temperature of the wafer W may be suppressed. In FIG. 13, the illustration of the first positioning pin 71a and the first hole 71, and the second positioning pin 72a and the second hole 72 is omitted. Further, the shadow ring 74 that is not fixed to the processing chamber 20 by the above-described positioning pins 71a and 72s does not correspond to the stage peripheral member of the example.

Further, the shadow ring 74 may be configured to be fixed to the processing chamber 20 similar to the stage peripheral member according to the present disclosure, and to also serve as a clamp ring (clamp member). By configuring in this manner, the positional shift of the shadow ring 74 may be decreased and the positional error with the wafer W placed on the stage 22 may be decreased. In this case, the shadow ring 74 also corresponds to the stage peripheral member of the example. The shadow ring 74 may be directly provided without using the separation ring 7.

Further, the stage peripheral member according to the present disclosure may be a focus ring configured to uniformly supply plasma to the wafer W placed on the stage 22.

It should be considered that the embodiments disclosed in here are exemplary and not restrictive in all aspects. The above-described embodiments may be omitted, replaced, or changed in various forms without departing from the scope of claims and the gist thereof. For example, the positioning pins 71a and 72 may be provided in the separation ring 7, and the holes 71 and 72 may be formed in the processing chamber 20 (shelf 203). Further, the relationship may be such that the fastening pin 69a is formed on the base 60 side, and the fastening hole 69 is formed on the processing chamber 20 side. A configuration in which the arrangement relationship between the pin and the hole corresponding to the pin is opposite to the example of the arrangement relationship illustrated in the embodiments should be included in the scope of this right.

EXAMPLE

In order to verify the effect of the substrate processing apparatus 2 according to the present disclosure, as Example, the separation ring 7 described in the first embodiment is used, the processing chamber 20 is heated to the temperature at the processing of the wafer W, the stage 22 is moved to the processing position, and the dimension between the stage 22 and the separation ring 7 is measured.

Further, as Comparative Example, the same processing as in Example is performed except that the separation ring 700 according to the comparative embodiment illustrated in FIGS. 4 and 5 is used, and the dimension between the stage 22 and the separation ring 700 is measured.

The margin m between the peripheral edge of the stage 22 and the inner edge of the separation ring 700 in order to avoid the contact between the stage 22 and the separation ring 700 in the unheated state of the processing chamber 20 is set to an equal distance (0.5 mm) in both Example and Comparative Example.

In the separation ring 700 of Comparative Example, the positional shift dimension D of the separation ring 700 amounts to 1 mm. Then, the gap between the stage 22 and the separation ring 700 at the processing of the wafer W amounts to 1.5 mm over the entire circumference.

In the separation ring 7 according to Example, the positional shift dimension D of the separation ring 7 may be suppressed to 0.2 mm. Then, the gap between the stage 22 and the separation ring 700 at the processing of the wafer W may be suppressed to 0.7 mm.

From the above verification results, by using the separation ring 7 according to the present disclosure, it may be said that the positional shift of the separation ring 7 in the heated state and the unheated state of the processing chamber 20 is decreased, and thus, the gap between the stage 22 and the separation ring 7 at the processing of the wafer W may be narrowed.

According to the present disclosure, in the substrate processing apparatus, the positional shift of the stage and the stage peripheral member in the unheated state and the heated state of the processing chamber may be decreased.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a processing chamber including a container body forming a processing room configured to process a substrate;
   a heater configured to heat the processing chamber;
   a support including a base positioned outside and thermally isolated from the processing room and fixed to the container body, and a stage inserted into an opening provided toward the processing room while being supported by the base at a position distant from a reference position in a horizontal direction, and configured to hold the substrate in the processing room, the reference position being a position where the base is fixed with respect to the processing chamber;
   a separation ring provided on a shelf of the processing chamber, the separation ring being positioned in the processing chamber to surround an outer periphery of the stage in a state of being inserted into the opening;
   a first positioning pin fixed to the processing chamber to position the separation ring; and
   a second positioning pin fixed to a position farther than the first positioning pin when viewed from the reference position in plan view,
   wherein the separation ring includes:
      a first hole into which the first positioning pin is inserted in order to fix the separation ring with respect to the processing chamber; and
      a second hole into which the second positioning pin is inserted, and formed in an elongated hole shape along a direction in which the second positioning pin moves in response to expansion and contraction of the processing chamber according to switching between a heated state by the heater and a non-heated state.

2. The substrate processing apparatus according to claim 1, wherein a pair of the second hole and the second positioning pin inserted into the second hole is provided in plural.

3. The substrate processing apparatus according to claim 2, wherein an opening of the separation ring is provided at a position where the stage supported via the base fixed to the reference position is positioned at a center of the separation ring when the processing chamber is in the heated state and expands.

4. The substrate processing apparatus according to claim 3, wherein the processing chamber includes a plurality of processing rooms each having the stage and the separation ring corresponding to the stage disposed therein, and
   the support includes a common base that supports the stages disposed in the plurality of processing rooms.

5. The substrate processing apparatus according to claim 4, wherein the separation ring partitions atmosphere in the processing room above the stage and atmosphere in the processing room below the stage.

6. The substrate processing apparatus according to claim 1, wherein an opening of the separation ring is provided at a position where the stage supported via the base fixed to the reference position is positioned at a center of the separation ring when the processing chamber is in the heated state and expands.

7. The substrate processing apparatus according to claim 1, wherein the processing chamber includes a plurality of processing rooms each having the stage and the separation ring corresponding to the stage disposed therein, and
   the support includes a common base that supports the stages disposed in the plurality of processing rooms.

8. The substrate processing apparatus according to claim 1, wherein the separation ring partitions atmosphere in the processing room above the stage and atmosphere in the processing room below the stage.

9. The substrate processing apparatus according to claim 1, wherein the support includes a lift that moves the stage up and down with respect to the base between a transport position of the substrate set below the opening and a processing position for processing the substrate.

10. The substrate processing apparatus according to claim 1, wherein the base is fastened to the processing chamber by a first fastening pin provided at the reference position and a second fastening pin provided at a position distant from the reference position, and
    the second fastening pin is fixed to the processing chamber by penetrating a fastening hole that constitutes the base, is formed in a member fastened with the processing chamber, and is formed in an elongated hole shape along a direction in which the second fastening pin moves in response to the expansion and the contraction of the processing chamber.

11. A substrate processing method using a substrate processing apparatus including:
    a processing chamber including a processing room configured to process a substrate;
    a heater configured to heat the processing chamber;
    a support including a base positioned outside and thermally isolated from the processing room and fixed to the container body, and a stage inserted into an opening provided toward the processing room while being supported by the base at a position distant from the reference position in a horizontal direction, and configured to hold the substrate in the processing room, the reference position being a position where the base is fixed with respect to the processing chamber; and
    a separation ring provided on a shelf of the processing chamber, the separation ring being positioned in the processing chamber to surround an outer periphery of the stage in a state of being inserted into the opening;
    a first positioning pin fixed to the processing chamber to position the separation ring; and a second positioning pin fixed to a position farther than the first positioning pin when viewed from the reference position in plan view, wherein the separation ring includes:
- a first hole into which the first positioning pin is inserted in order to fix the separation ring with respect to the processing chamber; and
- a second hole into which the second positioning pin is inserted, and formed in an elongated hole shape along a direction in which the second positioning pin moves in response to expansion and contraction of the processing chamber according to switching between a heated state by the heater and a non-heated state, the substrate processing method comprising:

switching the processing chamber from the non-heated state to the heated state;

moving the second positioning pin along the second hole in response to the expansion of the processing chamber according to the switching to the heated state and positioning the stage supported via the base fixed to the reference position to a center position of the separation ring; and holding the substrate toward the processing room while the stage is positioned at the center position to process the substrate.

* * * * *